United States Patent [19]

Kobayashi et al.

[11] Patent Number: 4,615,741

[45] Date of Patent: Oct. 7, 1986

[54] FILLER FOR ELECTRONIC ELEMENT ENCAPSULATION RESIN AND ELECTRONIC ELEMENT ENCAPSULATION RESIN COMPOSITION CONTAINING THE SAME

[75] Inventors: Akira Kobayashi; Ryoichi Ide; Hirotaka Koga, all of Oomuta, Japan

[73] Assignee: Denki Kagaku Kogyo Kabushiki Kaisha, Tokyo, Japan

[21] Appl. No.: 669,557

[22] Filed: Nov. 8, 1984

[30] Foreign Application Priority Data

Nov. 30, 1983 [JP] Japan ................................ 58-226285

[51] Int. Cl.$^4$ ............................................. C04B 14/04
[52] U.S. Cl. ........................... 106/308 M; 106/287.34; 523/443; 524/493
[58] Field of Search ....................... 106/308 M, 287.34; 524/493; 523/443

[56] References Cited

U.S. PATENT DOCUMENTS 3,975,757  8/1976  Sporck .................................. 357/72
3,985,842  10/1976  Scott ..................................... 264/12
4,248,920  2/1981  Yoshizumi ........................... 523/465

*Primary Examiner*—Amelia B. Yarbrough
*Attorney, Agent, or Firm*—Jordan and Hamburg

[57] ABSTRACT

According to the invention, a filler for an electronic element encapsulation resin composition is provided. The filler comprises 5 to 95 parts by weight of fused silica beads of generally spherical form and 95 to 5 parts by weight of crushed particles of fused silica of rugged form. The resin composition admixed with the filler has excellent fluidity without the formation of burs when molded.

9 Claims, No Drawings

FILLER FOR ELECTRONIC ELEMENT ENCAPSULATION RESIN AND ELECTRONIC ELEMENT ENCAPSULATION RESIN COMPOSITION CONTAINING THE SAME

BACKGROUND OF THE INVENTION

1. Field of the Invention

The present invention relates to a filler for adding to an electronic element encapsulation resin, and a resin composition containing the same for encapsulating an electronic element.

2. Prior Art

Pulverized fused silica products have hitherto been used as the fillers for encapsulation materials for encapsulating electronic elements, such as IC and LSI elements, and for electric insulation materials. One type of such pulverized fused silica products is a powder prepared by crushing a fused silica ingot to have a preset particle size. Although a resin composition excellent in electric insulation properties can be prepared by admixing such a crushed powder product of fused silica with a thermosetting resin, such as epoxy, silicone, phenol or polyester resins, the resin composition admixed with the crushed fused silica filler has an extremely high viscosity so that difficulties are encountered in the subsequent steps since the crushed particles have rugged surfaces and lack smoothness for facilitating easy molding.

Another type fused silica product has been known, which is produced by jetting a powder of a silicon compound, such as a quartz or silica powder and a decomposition product of silane compound, into a furnace together with a combustible gas and oxygen gas to be melted at a temperature of higher than 1800° C. and collecting solidified beads by a cyclone or a bag filter. Japanese Patent Laid-Open Publication No. 145613/1983 (TOKKYO KOKAI KOHO NO. SHO-58-145613) discloses an example of such products. Since the fused silica beads have smooth and round surfaces, increase in viscosity of a resin composition mixed therewith is little so that the resin composition can be handled with ease in the subsequent operations. However, the conventional resin composition admixed with fused silica beads has a disadvantage that the molded products thereof are suffering from formation of burs.

OBJECTS AND SUMMARY OF THE INVENTION

A primary object of this invention is to provide a filler for an electronic element encapsulation resin composition which has improved fluidity and workability to be molded without the formation of burs to give a molded product excellent in electric insulation properties.

Another object of this invention is to provide a resin composition admixed with the filler to be suited for encapsulating electronic elements.

The above and other objects of the invention will become apparent from the following detailed description of the invention.

The filler for an electronic element encapsulation resin composition, according the the present invention, comprises: 5 to 95 parts, by weight, of fused silica beads each having the largest particle size of substantially not more than 149 $\mu$m and containing not less than 80 wt % of beads each having particle size within the range of from 1 to 149 $\mu$m, the ratio of the largest diametral length across each bead to the smallest diametral length thereacross being 1 to 1.5; and 95 to 5 parts, by weight, of crushed particles of fused silica each having the largest particle size of substantially not more than 149 $\mu$m and containing not less than 80 wt % of particles each having particle size within the range of from 1 to 149 $\mu$m, the ratio of the largest diametral length across each crushed particle to the smallest diametral length thereacross being 1.6 to 3.0.

Also provided in accordance with the invention is a thermosetting resin composition for encapsulating an electronic element and containing 30 to 80 wt % of a fused silica filler, said fused silica filler comprising: 5 to 95 parts, by weight, of fused silica beads each having the largest particle size of substantially not more than 149 $\mu$m and containing not less than 80 wt % of beads each having particle size within the range of from 1 to 149 $\mu$m, the ratio of the largest diametral length across each bead to the smallest diametral length thereacross being 1 to 1.5; and 95 to 5 parts, by weight, of crushed particles of fused silica each having the largest particle size of substantially not more than 149 $\mu$m and containing not less than 80 wt % of particles each having particle size within the range of from 1 to 149 $\mu$m, the ratio of the largest diametral length across each crushed particle to the smallest diametral length thereacross being 1.6 to 3.0.

DESCRIPTION OF THE INVENTION

The present invention will be described in detail hereinbelow.

In the present invention, fused silica beads and crushed particles of fused silica are used in combination. Both of the fused silica beads and the crushed particles of fused silica used in the invention should have the largest particle size of substantially not more than 149 $\mu$m and contain not less than 80 wt % of particles having particle sizes within the range of from 1 to 149 $\mu$m. If the largest particle size of the filler exceeds the defined range, the molding property of a resin composition admixed therewith is adversely affected to cause clogging at the gate of a mold. On the other hand, if the content of particles having particle sizes within the range of from 1 to 149 $\mu$m is less than 80 wt %, the fluidity at the molding step of a composition admixed with the filler is lowered due to excessively high content of finer particles to be unsuited for practical molding operation.

Meantime, throughout the specification and appended claims, the particle sizes of both of the fused silica beads and the crushed particles of fused silica are defined by the expression "substantially not more than 149 $\mu$m", since inclusion of particles having particle sizes ranging within 149 $\mu$m to 200 $\mu$m is tolerated provided that the content thereof is less than 2 wt %. A filler containing particles having particle sizes of from 149 $\mu$m to 200 $\mu$m in an amount of less than 2 wt % may be used without the fear of gate clogging problem.

It is desirous that both of the fused silica beads and the crushed particles of fused silica contain less than 100 ppm of alkali ingredients, such as $Na_2O$ and $K_2O$, and have the $SiO_2$ purity of not less than 97 wt %. The electric insulation properties of a resin composition admixed with a filler might be deteriorated, if the filler contains alkali ingredients in an amount more than 100 ppm.

Each of the fused silica beads should have the ratio of the largest diametral length thereacross to the smallest diametral length thereacross of 1 to 1.5. If the ratio exceeds the defined range, the fluidity of a resin composition admixed with the filler is lowered and cannot be improved. Fused silica beads may be prepared by spraying or jetting a powder of quartz or silica having a particle size of not more than 149 μm and containing, preferably, not more than 100 ppm of alkali ingredients into a shaft kiln together with a combustible gas and oxygen gas to melt the particles at a temperature of not less than 1750° C., preferably not less than 1800° C., to form beads which are collected by a cyclone or a bag filter. Fused silica beads having particle sizes of substantially not more than 149 μm and containing not less than 80 wt % of particles having particle sizes within the range of from 1 to 149 μm are prepared by the aforementioned jetting process.

Each of the crushed particles of fused silica should have the ratio of the largest diametral length across each crushed particle to the smallest diametral length thereacross of 1.6 to 3.0. If the ratio is less than the defined range, the filler is not suited for practical use due to formation of burs, whereas the fluidity of a composition admixed with the filler is lowered if the ratio is more than 3.0 even when fused silica beads are mixed together.

Crushed particles of fused silica may be prepared by crushing an ingot of fused silica in a crusher, screening the crushed silica to select lumps having desired dimensions, subjecting the selected lumps to magnetic separation and acid treatment, and then pulverizing in a mill lined with corundum to have the largest particle size of substantially not more than 149 μm and to contain not less than 80 wt % of particles having particle sizes within the range of from 1 to 149 μm.

5 to 95 parts, by weight, of the fused silica beads are mixed with 95 to 5 parts, by weight, of the crushed particles of fused silica to prepare the filler of the invention to be admixed with a resin composition adapted for encapsulating electronic elements. If the content of the fused silica beads is less than 5 parts, by weight, namely the content of the crushed particles of fused silica is more than 95 parts, by weight, the fluidity of a resin composition admixed with the filler is lowered to an extent unsuited for practical use. On the contrary, if the content of fused silica beads is more than 95 parts, by weight, namely the content of crushed particles of fused silica is less than 5 parts, by weight, serious bur formation results at the step of molding a resin composition admixed with the filler although the resin composition has an excellent fluidity.

The thermosetting resin composition for encapsulating electronic elements, according to the present invention, is prepared by admixing 30 to 80 wt % of the filler of the invention with a thermosetting resin. If the content of the filler is less than 30 wt %, the electric insulation properties become inferior, whereas the fluidity of the resin composition becomes inferior if the content of the filler is more than 80 wt %.

Epoxy resins, silicone resins, phenol resins and polyester resins may be used as the thermosetting resin in the resin composition of the invention.

In preparation of the resin composition of the invention, the filler of the invention is added to a thermosetting resin in an admixing ratio as defined herein together with other optional adducts, such as a wax serving as an internal releasing agent, a reaction promoter and a pigment, and then the admixture is kneaded by means of a known kneading device, such as roller, kneader or Banbury mixer.

The thus prepared resin composition has a spiral flow of not less than 40 inches and a molded product produced from the resin composition has a bur length of less than 2 mm. The resin composition may conveniently used for encapsulating electronic elements, such as IC or LSI, and for insulating a transistor.

EXAMPLES OF THE INVENTION

The present invention will now be described more specifically by referring to examples thereof.
(1) Preparaton of Fused Silica Beads:

The silica powder designated by "Product of India" having the composition and the distribution of particle size as set forth in Table 1 was jetted into a shaft kiln together with a hydrogen gas ($H_2$ Purity: 95 vol %) and an oxygen gas ($O_2$ Purity: 99 vol %) mixed in a ratio by volume of 2.5:1 while controlling the temperature of the jet flame at 1850° C., whereby the powder was melted to form mists of fused silica which were solidified to form fused silica beads. The fused silica beads were collected by a cyclone or bag filter. Table 2 shows the contents of alkali ingredients, the distribution of particle size and the ratio of the largest diametral length across each bead to the smallest diametral length thereacross.

For the comparison purpose, also shown in Table 2 are the contents of alkali ingredients, the distribution of particle size, the ratio of the largest diametral length across each bead to the smallest diametral length thereacross of a finer particle size silica bead product (having a maximum particle size of less than 1 μm) produced by an electric furnace reduction process and those of a glass bead product available from Toshiba-Ballotini Co., Ltd. under the Trade designation "EGB-731".
(2) Preparation of Crushed Particles of Fused Silica:

The silica powder designated by "Product of India" having the composition and the distribution of particle size as set forth in Table 1 was heated to melt by a gas flame of 1900° C. formed by jetting a hydrogen gas ($H_2$ Purity: 95 vol %) and an oxygen gas ($O_2$ Purity: 99 vol %) mixed in a ratio by volume of 2.5:1, whereby an ingot of fused silica was prepared. The ingot of fused silica was crushed by a crusher and then screened through a sieve of 1 mm mesh to separate particles having particle sizes of not less than 1 mm. The thus separated particles were subjected to an acid treatment, and then charged into a mill lined with corundum to be crushed by corundum balls to prepare crushed particles of fused silica. Table 2 shows the contents of alkali ingredients, the distribution of particle size and the ratio of the largest diametral length across each bead to the smallest diametral length thereacross.
(3) Preparation of Filler and Resin Composition Admixed with the Filler:

The fused silica beads and the crushed particles of fused silica, prepared in the manner as described above, were mixed in the ratios as set forth in Table 3 to prepare the fillers (A), (B), (C), (D), (E), (F), (G), (H), (I), (J), and (K). Separately, a mixed resin composition was prepared by mixing 100 parts by weight of cresol novolac base eposy resin, 38 parts by weight of phenol novolac resin and 2 parts by weight of carnauba wax. The mixed resin composition was then admixed with each of the fillers in an admixing ratio, respectively, as set forth in Table 3. Each of the admixtures of the resins and the fillers was heated to 80° C. to 100° C., kneaded by an 8-inch mixing roller device for about 10 minutes to obtain a homogeneous admixture which was cooled and then pulverized. The fluidity of each resin composition, the length of burs formed at the molding step and the volume resistivity of the molded product were measured. The results are shown in Tables 4 and 5.

In tables 4 and 5, Run Nos. 2 to 4, 7 to 9, 12 to 14, 17 to 19 and 22 to 24 are embodiments of the invention, and the other runs are comparison experiments wherein the compositions of Run Nos. 35 and 45 could not be molded and hence the bur length and the volume resistivity of those compositions could not be measured.

TABLE 1

| Chemical Composition | | | | | Distribution of Particle Size (wt %) | | | | | | |
|---|---|---|---|---|---|---|---|---|---|---|---|
| $SiO_2$ (wt %) | $Al_2O_3$ (ppm) | $Fe_2O_3$ (ppm) | $Na_2O$ (ppm) | $K_2O$ (ppm) | <10 μm | 10~20 μm | 20~30 μm | 30~44 μm | 44~74 μm | 74~149 μm | >149 μm |
| 99.8 | 33 | 20 | 17 | 20 | 25 | 16 | 17 | 19 | 16 | 7 | 0 |

TABLE 2

| | Alkali Ingredients (ppm) | | Distribution of Particle Size (wt %) | | | | | | | | Ratio of Largest Diametrical Length to Smallest Diametrical Length |
|---|---|---|---|---|---|---|---|---|---|---|---|
| | $Na_2O$ | $K_2O$ | <1 μm | 1~10 μm | 10~20 μm | 20~30 μm | 30~44 μm | 44~74 μm | 74~149 μm | >149 μm | |
| Fused Silica Beads | 18 | 26 | 2 | 21 | 16 | 16 | 20 | 17 | 8 | 0 | 1.0~1.1 |
| Crushed Particle of Fused Silica | 50 | 45 | 2 | 23 | 17 | 18 | 16 | 17 | 7 | 0 | 1.8~2.5 |
| Fine Bead Form Silica | 1700 | 14000 | 100 | 0 | 0 | 0 | 0 | 0 | 0 | 0 | 1.0~1.1 |
| Glass Beads Trade Name "EGB-731" | 2000 | 1400 | | | | 10 | | 42 | 43 | 5 | 1.0~1.1 |

TABLE 3

| | | Composition (part by weight) | |
|---|---|---|---|
| | | Fused Silica Beads | Crushed Particles of Fused Silica |
| Present Invention | A | 95 | 5 |
| | B | 70 | 30 |
| | C | 50 | 50 |
| | D | 30 | 70 |
| | E | 5 | 95 |
| Reference | F | 96 | 4 |
| | G | 4 | 96 |
| | H | 100 | 0 |
| | I | 0 | 100 |
| | | Fine Bead Form Silica | Crushed Particles of Fused Silica |
| Reference | J | 50 | 50 |
| | | Glass Beads Trade Name "EGB-731" | Crushed Particles of Fused Silica |
| | K | 50 | 50 |

TABLE 4

| | | Filler | | | | | | | | | | | | | |
|---|---|---|---|---|---|---|---|---|---|---|---|---|---|---|---|
| | | A | | | | | B | | | | | C | | | | |
| Run No. | | 1 | 2 | 3 | 4 | 5 | 6 | 7 | 8 | 9 | 10 | 11 | 12 | 13 | 14 | 15 |
| Content of Filler | Admixed Quantity (part by weight) | 47 | 60 | 396 | 560 | 794 | 47 | 60 | 396 | 560 | 794 | 47 | 60 | 396 | 560 | 794 |
| | Content (wt %) | 25.1 | 30.0 | 73.9 | 80.0 | 85.0 | 25.1 | 30.0 | 73.9 | 80.0 | 85.0 | 25.1 | 30.0 | 73.9 | 80.0 | 85.0 |
| Spiral Flow (inch) | | 85 | 80 | 66 | 53 | 25 | 79 | 73 | 60 | 49 | 23 | 72 | 67 | 53 | 45 | 21 |
| Length of Bur (mm) | Clearance 5μ | 3.2 | 2.0 | 1.6 | 0.8 | 0.8 | 3.0 | 1.8 | 1.4 | 1.0 | 0.8 | 3.2 | 1.4 | 1.2 | 1.0 | 0.8 |
| | Clearance 50μ | 6.0 | 2.0 | 1.6 | 1.2 | 1.0 | 4.8 | 1.8 | 1.6 | 1.0 | 0.8 | 4.6 | 1.6 | 1.4 | 1.2 | 0.8 |
| Volume Resistivity (150° C.) log ρ (Ω-cm) | | 12.1 | 13.5 | 14.2 | 14.2 | 14.3 | 12.1 | 13.5 | 14.2 | 14.2 | 14.3 | 12.1 | 13.5 | 14.2 | 14.2 | 14.3 |

| | | Filler | | | | | | | | | |
|---|---|---|---|---|---|---|---|---|---|---|---|
| | | D | | | | | E | | | | |
| Run No. | | 16 | 17 | 18 | 19 | 20 | 21 | 22 | 23 | 24 | 25 |
| Content of Filler | Admixed Quantity (part by weight) | 47 | 60 | 396 | 560 | 794 | 47 | 60 | 396 | 560 | 794 |
| | Content (wt %) | 25.1 | 30.0 | 73.9 | 80.0 | 85.0 | 25.1 | 30.0 | 73.9 | 80.0 | 85.0 |
| Spiral Flow (inch) | | 70 | 62 | 50 | 43 | 21 | 70 | 59 | 45 | 40 | 20 |
| Length of Bur (mm) | Clearance 5μ | 3.0 | 1.5 | 1.1 | 0.8 | 0.6 | 3.0 | 1.5 | 1.0 | 0.8 | 0.6 |
| | Clearance 50μ | 4.5 | 1.6 | 1.3 | 1.1 | 0.7 | 4.5 | 1.5 | 1.2 | 1.0 | 0.6 |
| Volume Resistivity (150° C.) log ρ (Ω-cm) | | 12.1 | 13.5 | 14.2 | 14.2 | 14.3 | 12.1 | 13.5 | 14.2 | 14.2 | 14.3 |

TABLE 5

| | | Filler | | | | | | | | | | | | | | |
|---|---|---|---|---|---|---|---|---|---|---|---|---|---|---|---|---|
| | | F | | | | | G | | | | | H | | | | |
| Run No. | | 26 | 27 | 28 | 29 | 30 | 31 | 32 | 33 | 34 | 35 | 36 | 37 | 38 | 39 | 40 |
| Content of Filler | Admixed Quantity (part by weight) | 47 | 60 | 396 | 560 | 794 | 47 | 60 | 396 | 560 | 794 | 47 | 60 | 396 | 560 | 794 |
| | Content (wt %) | 25.1 | 30.0 | 73.9 | 80.0 | 85.0 | 25.1 | 30.0 | 73.9 | 80.0 | 85.0 | 25.1 | 30.0 | 73.9 | 80.0 | 85.0 |
| Spiral Flow (inch) | | 86 | 81 | 69 | 54 | 21 | 80 | 56 | 32 | 23 | 3 | 94 | 92 | 80 | 64 | 33 |
| Length of Bur (mm) | Clearance 5μ | 4.5 | 4.0 | 3.0 | 2.4 | 2.4 | 4.1 | 3.3 | 1.0 | 0.8 | — | 18.0 | 15.2 | 13.0 | 6.0 | 4.5 |
| | Clearance 50μ | 7.0 | 6.2 | 5.2 | 4.5 | 3.8 | 6.3 | 3.4 | 1.4 | 1.0 | — | 28.0 | 25.2 | 20.5 | 11.0 | 6.2 |
| Volume Resistivity (150° C.) log ρ (Ω-cm) | | 12.1 | 13.5 | 14.2 | 14.2 | 14.3 | 12.1 | 13.5 | 14.2 | 14.2 | — | 12.1 | 13.5 | 14.2 | 14.2 | 14.3 |

| | | Filler | | | | | | | | | | |
|---|---|---|---|---|---|---|---|---|---|---|---|---|
| | | I | | | | | J | | | K | | |
| Run No. | | 41 | 42 | 43 | 44 | 45 | 46 | 47 | 48 | 49 | 50 | 51 |
| Content of Filler | Admixed Quantity (part by weight) | 47 | 60 | 396 | 560 | 794 | 60 | 396 | 560 | 60 | 396 | 560 |
| | Content (wt %) | 25.1 | 30.0 | 73.9 | 80.0 | 85.0 | 30.0 | 73.9 | 80.0 | 30.0 | 73.9 | 80.0 |
| Spiral Flow (inch) | | 70 | 55 | 32 | 20 | 3 | 50 | 49 | 43 | 52 | 48 | 45 |
| Length of Bur (mm) | Clearance 5μ | 4.0 | 3.2 | 0.8 | 0.6 | — | 1.2 | 1.2 | 1.0 | 3.6 | 2.6 | 2.2 |
| | Clearance 50μ | 6.1 | 3.3 | 1.2 | 1.0 | — | 1.6 | 1.4 | 1.2 | 5.8 | 4.8 | 4.3 |
| Volume Resistivity (150° C.) log ρ (Ω-cm) | | 12.1 | 13.5 | 14.2 | 14.2 | — | 12.9 | 12.2 | 12.1 | 12.8 | 12.4 | 12.2 |

The data set forth in Tables 1, 2, 4 and 5 were determined in accordance with the following test methods.

(1) Chemical Composition:
   $SiO_2$—Chemical Analysis (Unit: wt %)
   $Al_2O_3$—Atomic Absorption Method (Unit: ppm)
   $Fe_2O_3$—Atomic Absorption Method (Unit: ppm)
   $Na_2O$—Atomic Absorption Method (Unit: ppm)
   $K_2O$—Atomic Absorption Method (Unit: ppm)

(2) Distribution of Particle Size:
   Sedimentation Balance Method (Unit: wt %)

(3) Ratio of the Largest Diametral Length across Each Particle to the Smallest Diametral Length Thereacross:
   JIS R6002 Microscopic Magnification Analysis (4) Spiral Flow:
   Using a mold prepared generally in accordance with the EMMI Standard, the spiral flow of each test specimen was determined at a molding temperature of 160° C. and a molding pressure of 70 kg/cm². (Unit: inch)

(5) Bur-Forming Property:
   Using bur appraisal molds, respectively, having clearances of 5μ and 50μ, the lengths of burs of molded products were measured.

(6) Volume Resistivity:
   Each resin composition was molded at a molding temperature of 160° C. and at a molding pressure of 70 kg/cm², followed by curing at 160° C. for additional 2 hours, and then the volume resistivity of each of the molded and after-cured products at 150° C. was measured using an insulation resistance tester.

Although the present invention has been described with reference to the preferred embodiment, it should be understood that various modifications and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

What is claimed is:

1. A filler for an electronic element encapsulation resin composition, comprising: 5 to 95 parts, by weight, of fused silica beads each having the largest particle size of substantially not more than 149 μm and containing not less than 80 wt % of beads each having particle size within the range of from 1 to 149 μm, the ratio of the largest diametral length across each bead to the smallest diametral length thereacross being 1 to 1.5; and 95 to 5 parts, by weight, of crushed particles of fused silica each having the largest particle size of substantially not more than 149 μm and containing not less than 80 wt % of particles each having particle size within the range of from 1 to 149 μm, the ratio of the largest diametral length across each crushed particle to the smallest diametral length thereacross being 1.6 to 3.0.

2. The filler as recited in claim 1, wherein the fused silica forming said beads and said crushed particles contains not more than 100 ppm of alkali ingredients.

3. The filler as recited in claim 1, wherein the fused silica forming said beads and said crushed particles has an $SiO_2$ purity of not less than 97 wt %.

4. The filler as recited in claim 1, wherein said fused silica beads are prepared by spraying quartz powder or silica powder together with a combustible gas and oxygen to form mists of molten silica at a temperature of not lower than 1750° C. followed by cooling the mists to form generally spherical beads.

5. The filler as recited in claim 1, wherein said crushed particles are prepared by the steps of crushing an ingot of fused silica by a crusher, screening the crushed silica to select lumps having desired dimensions, subjecting the selected lumps to magnetic separation and acid treatment, and then pulverizing said selected lumps.

6. A thermosetting resin composition for encapsulating an electronic element and containing 30 to 80 wt % of a fused silica filler, said fused silica filler comprising: 5 to 95 parts, by weight, of fused silica beads each having the largest particle size of substantially not more than 149 μm and containing not less than 80 wt % of beads each having particle size within the range of from 1 to 149 μm, the ratio of the largest diametral length across each bead to the smallest diametral length thereacross being 1 to 1.5; and 95 to 5 parts, by weight of crushed particles of fused silica each having the largest particle size of substantially not more than 149 μm and containing not less than 80 wt % of particles each having particle size within the range of from 1 to 149 μm, the ratio of the largest diametral length across each crushed particle to the smallest diametral length thereacross being 1.6 to 3.0.

7. The resin composition as recited in claim 6, wherein said thermosetting resin is selected from the group consisting of epoxy resins, silicone resins, phenol resins and polyester resins.

8. The resin composition as recited in claim 6, further comprising at least one of waxes and pigments.

9. An electronic element encapsulated in a resin composition containing a filler according to claim 1.

* * * * *